March 3, 1959 R. C. SANDERS, JR 2,876,390

MOUNTING DEVICE FOR ELECTRICAL COMPONENTS

Filed Dec. 9, 1953 2 Sheets-Sheet 1

Royden C. Sanders Jr.
*INVENTOR.*

BY [signature]
Attorney

March 3, 1959 R. C. SANDERS, JR 2,876,390

MOUNTING DEVICE FOR ELECTRICAL COMPONENTS

Filed Dec. 9, 1953 2 Sheets-Sheet 2

Royden C. Sanders Jr.
*INVENTOR.*

BY [signature]
Attorney

United States Patent Office 2,876,390

Patented Mar. 3, 1959

2,876,390

MOUNTING DEVICE FOR ELECTRICAL COMPONENTS

Royden C. Sanders, Jr., Nashua, N. H., assignor, by mesne assignments, to Sanders Associates, Inc., Nashua, N. H., a corporation of Delaware Application December 9, 1953, Serial No. 397,226

2 Claims. (Cl. 317—101)

This invention relates to electronic apparatus, its elements and components and to improvement in the construction and manufacture thereof. More particularly, this invention relates to a mounting device for electrical components.

The invention is especially useful in connection with the mechanized production systems for apparatus of the type described. There are described in my copending application No. 391,617, now Patent No. 2,816,252, improved assemblies utilizing wafer elements such as might be employed in the present invention and reference may be had to such application for a detailed description thereof.

An object of the present invention is to provide an improved mounting device for electrical components, which is useful in systems of the character described.

A further object of the invention is to provide an improved mounting device for electrical components which includes wafer elements and a base plate arrangement so constructed as to present a compact assembly unit which is both of economical and precise construction.

Other and further objects of the invention will be apparent from the following description of preferred embodiments thereof, taken in connection with the accompanying drawings.

In accordance with the present invention, there is provided a mounting device for electrical components. The device comprises an insulation wafer and a plurality of integrally formed projecting tabs extending from an edge of the wafer. A conductive tab in the plane of a wafer face is intimately bonded to selected ones of the projecting tabs. An electrical component is mounted on the face of the wafer and conductive paths are intimately bonded to the wafer faces connecting selected terminals of the component and selected conductive tabs. There is also provided an insulation panel supporting other electrical components and having conductive connection paths intimately bonded thereto. Apertures are in the insulation panel and are so spaced as to register with and engage the projecting tabs of the wafer and secure the wafer perpendicular to the insulation panel. The conductive connection paths extend from certain of the apertures to connect selectively the other electrical components and the conductive tabs after being solder secured thereto.

Figures 1, 2, 3:
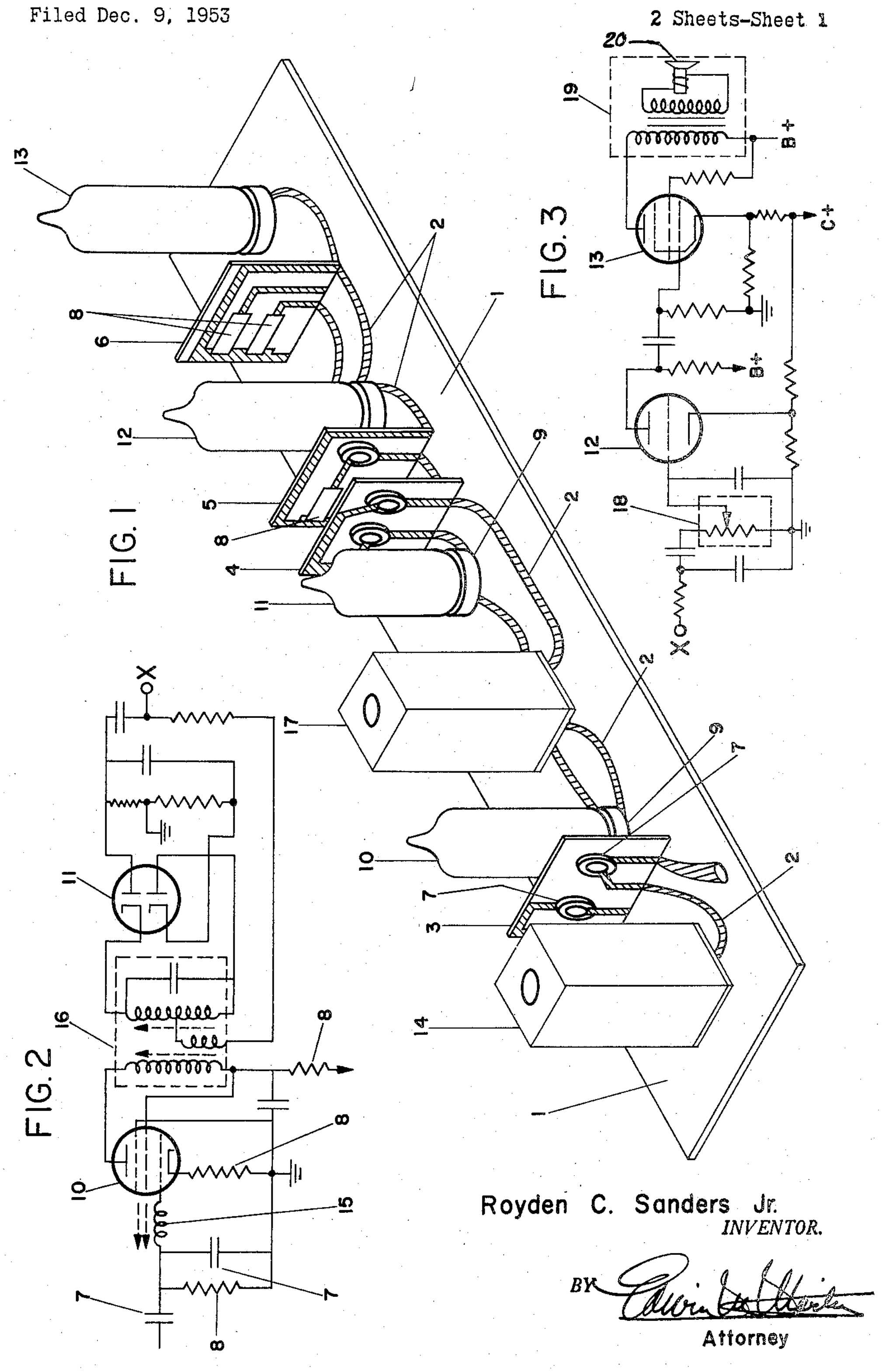
Figure 4:
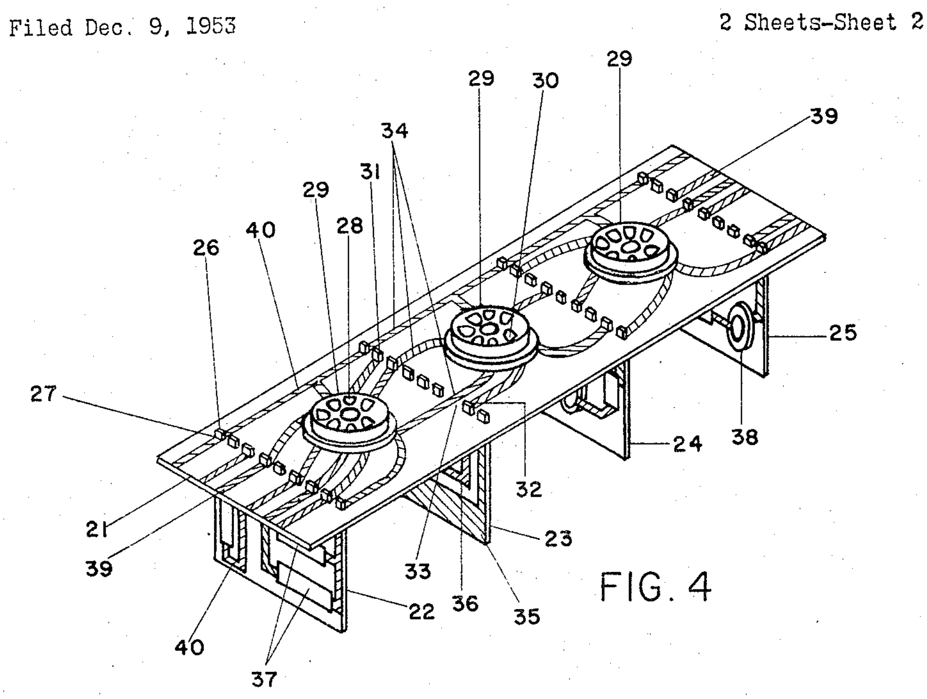
Figure 5:
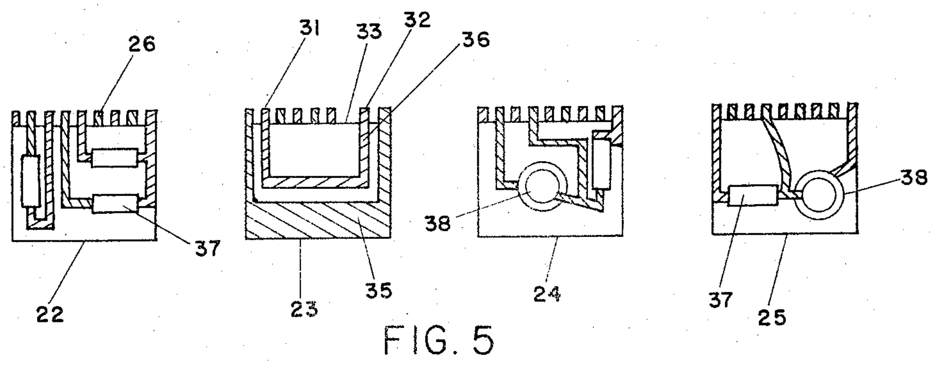

In the accompanying drawings, Fig. 1 is an isometric view of a composite unit embodying the present invention; Fig. 2 is a schematic circuit diagram of a portion of the unit of Fig. 1; Fig. 3 is a schematic circuit diagram of another portion of the unit of Fig. 1; Fig. 4 is an isometric view of another composite unit embodying the present invention; and Fig. 5 is a group of side views of the wafer elements of the unit of Fig. 4.

Referring now in more detail to the drawings, the composite unit of Fig. 1 comprises an insulation panel 1 which is formed of a non-conductive material such as a plastic and has conductive paths (shown cross-hatched) of a material, such as copper, formed thereon to provide the connecting paths 2 between electrical components.

Insulation wafers 3, 4, 5 and 6 are secured to the insulation panel as hereinafter described in more detail with reference to the embodiments shown in Figs. 4 and 5. The insulation wafers carry capacitors 7 and resistors 8, as shown.

The insulation panel also carries sockets 9 for vacuum tubes and secured in these sockets are the amplifier tube 10, detector tube 11, and amplifier tubes 12 and 13. The housing 14 of the variable inductor 15 is shown mounted at one end of the insulation panel. The paths 2 of electrically conductive material, which are formed on the panel 1, interconnect the inductor as well as the tubes and wafer components.

In Figs. 2 and 3 the circuit diagram of the system is illustrated. This comprises a complete sound circuit of a typical television receiver and for convenience is illustrated in the drawing as broken at the connection X. The sound circuit comprises the I. F. amplifier, which includes the pentode tube 10, and its associated capacitors 7 and resistors 8 and the variable inductor 15 which is included in the housing 14 on the base plate. These elements comprise the input circuit of the amplifier as shown. The output of this amplifier, that is the intermediate frequency carrier, is coupled through a ratio detector transformer 16 to the dual diode ratio detector tube 11, as shown. The housing 17 of the transformer 16 is indicated in Fig. 1.

An audio output signal is produced by the detector in its output circuit in the conventional manner. This output circuit comprises the reactance elements as shown and is connected at points X to the second portion of the circuit which is shown in Fig. 3. It is coupled by way of the input resistor and capacitor elements including the volume control resistor 18, as shown, to the amplifier tube 12. The circuit components between the tubes 11 and 12 are carried by the insulation wafers 4 and 5, as indicated. The signal output from the amplifier tube 12 is coupled by way of suitable components including the capacitors and resistors carried by the insulation wafer 6 to the second amplifier 13. Here the signal is again amplified and thereafter it is applied by way of the audio output transformer 19 to the loud speaker 20. The transformer 19 and speaker 20 do not, of course, form part of the unit of Fig. 1.

In Fig. 4 there is illustrated an isometric view of another embodiment of the present invention. Here there are secured to insulation panel 21 four insulation wafers 22, 23, 24 and 25. Resistors 37 and capacitors 38 are mounted on the insulation wafers and tube sockets 29 are secured in the insulation panel. For interconnecting the electrical components and tubes which fit into the sockets, there are provided connections in the form of paths of conductive material formed in the insulation panel and elements, similarly as in the embodiment of Fig. 1. These paths 40 are indicated by cross-hatching in Figs. 4 and 5. Connections 39 permit assembly to other units.

The insulation wafers in this embodiment are secured to the insulation panel in the same manner as are secured the respective elements of the embodiment of Fig. 1. More particularly, projecting tabs 26 are formed on edges of the insulation wafers and fitted into apertures 27 provided therefor in the insulation panels. These connections are suitably soldered and form sturdy mechanical joints between the insulation wafers and the insulation panel. The solder connection also completes electrical connections between the wafers and the panel.

In Fig. 5 there are illustrated the wafers 22, 23, 24 and 25, showing typical component connection configurations. Conductive tabs on the projections provide a surface suitable for soldering, to form the mechanical joints between the wafer and the insulation panel. The insulation wafer shown at 23 in Fig. 5 includes the crossover connection 36 as illustrated. By having conductive material disposed thereon in a path 35, surrounding the path 36, there is provided an electrostatic shield therefor.

It will be seen that the connections between certain points of the system present problems, in that there are no direct paths for such connections. For example, there is no longitudinal path permitting connection of contact 28 of one tube socket to the contact 30 of the adjacent tube socket. For such a connection, therefore, it is necessary to deviate from the plane of the base plate and make the connection by way of a plane of an insulation wafer. The connection may, therefore, be completed by way of insulation wafer 23 and thence from the wafer 23 by way of projecting tab 31, crossover connection 36 and projecting tab 32 to element 30. It will be noted that the projection which normally would be at the point 33 may be omitted to permit the longitudinal connection 34 between the two tube sockets.

In conventional practice electronic components such as are used in radio, radar, television and the like, comprise various elements which are usually mounted on metallic bases, suitably insulated therefrom. Such methods of mounting components include the use of relatively costly forming and soldering techniques. Also, conventional practice requires individual handling of components during the assembly process. It will be apparent that the present invention makes it eminently practical economically to fabricate large numbers of the units.

While there has been hereinbefore described what are at present considered preferred embodiments of the invention, it will be apparent to those skilled in the art that many and various changes and modifications may be made with respect to the embodiments illustrated without departing from the spirit of the invention. It will be understood, therefore, that all those changes and modifications as fall fairly within the scope of the appended claims are to be considered as a part of the present invention.

What is claimed is:

1. A mounting device for electrical components, comprising: an insulation wafer; a plurality of integrally formed, projecting tabs extending from an edge of said wafer; a conductive tab in the plane of a wafer face intimately bonded to selected ones of said projecting tabs; an electrical component mounted on a face of said wafer; conductive paths intimately bonded to said wafer faces connecting selected terminals of said component and selected conductive tabs; an insulation panel supporting other electrical components and having conductive connection paths intimately bonded thereto; and apertures in said insulation panel so spaced as to register with and engage the projecting tabs of said wafer and secure said wafer perpendicular to said insulation panel, said conductive connection paths extending from certain of said apertures to selectively connect said other electrical components and said conductive tabs after being solder secured thereto.

2. A mounting device for electrical components, comprising: a first insulation panel; a plurality of integrally formed projecting tabs of rectangular cross-section extending from an edge of said first panel; one conductive tab in the plane of a panel face intimately bonded to selected ones of said projecting tabs; an electrical component mounted on a face of said first panel; conductive paths intimately bonded to said first panel faces connecting selected terminals of said component and selected conductive tabs; a second insulation panel supporting other electrical components and having conductive connection paths intimately bonded thereto; and rectangular apertures in said second insulation panel so spaced as to register with and engage the projecting tabs of said first insulation panel and secure said first panel perpendicular to said second panel, said conductive connection paths extending from certain of said apertures to selectively connect said other electrical components and said conductive tabs after being solder secured thereto.

References Cited in the file of this patent

UNITED STATES PATENTS

| | | |
|---|---|---|
| 2,226,745 | Schrack | Dec. 31, 1940 |
| 2,433,384 | McLarn | Dec. 30, 1947 |
| 2,474,988 | Sargrove | July 5, 1949 |
| 2,707,272 | Blitz | Apr. 26, 1955 |
| 2,700,150 | Wales | Jan. 18, 1955 |
| 2,734,151 | Jacobs | Feb. 7, 1956 |

FOREIGN PATENTS

| | | |
|---|---|---|
| 357,171 | Great Britain | Sept. 10, 1931 |